United States Patent [19]

Hynecek

[11] Patent Number: 5,546,438
[45] Date of Patent: *Aug. 13, 1996

[54] BCD LOW NOISE HIGH SENSITIVITY CHARGE DETECTION AMPLIFIER FOR HIGH PERFORMANCE IMAGE SENSORS

[75] Inventor: Jaroslav Hynecek, Richardson, Tex.

[73] Assignee: Texas Instruments Incorporated, Dallas, Tex.

[ * ] Notice: The term of this patent shall not extend beyond the expiration date of Pat. No. 5,436,476.

[21] Appl. No.: 299,686

[22] Filed: Sep. 1, 1994

Related U.S. Application Data

[62] Division of Ser. No. 87,645, Jul. 2, 1993, Pat. No. 5,369,047.

[51] Int. Cl.[6] .......................... G11C 19/28; H01L 29/765
[52] U.S. Cl. ............................. 377/60; 257/217; 257/239
[58] Field of Search ............................. 257/239, 217; 377/60

[56] References Cited

U.S. PATENT DOCUMENTS

| | | | |
|---|---|---|---|
| 4,074,302 | 2/1978 | Brewer | 257/239 |
| 4,090,095 | 5/1978 | Herrmann | 257/239 |
| 4,668,971 | 5/1987 | Hynecek | 257/239 |
| 4,984,045 | 1/1991 | Matsunaga | 257/239 |
| 5,357,128 | 10/1994 | Shinji | 257/239 |
| 5,436,476 | 7/1995 | Hynecek | 257/239 |

FOREIGN PATENT DOCUMENTS 1457253  12/1972  European Pat. Off. .

*Primary Examiner*—Gene M. Munson
*Attorney, Agent, or Firm*—Alan K. Stewart; Richard L. Donaldson; William E. Hiller

[57] ABSTRACT

The image sensor charge detection amplifier has a charge storage well 60, a charge sensor 32 for sensing charge levels in the charge storage well 60, a charge drain 28 adjacent to the charge storage well 60, and charge transfer structures for transferring charge from the charge storage well 60 to the charge drain 28.

2 Claims, 3 Drawing Sheets

BCD LOW NOISE HIGH SENSITIVITY CHARGE DETECTION AMPLIFIER FOR HIGH PERFORMANCE IMAGE SENSORS

This is a divisional of application Ser. No. 08/087,645, filed Jul. 1, 1993, issued as U.S. Pat. No. 5,369,047 on Nov. 29, 1994.

CROSS-REFERENCE TO RELATED APPLICATIONS

The following coassigned patent application is incorporated herein by reference:

| Ser. No. | Filing Date | TI Case No. |
| --- | --- | --- |
| 08/048,038 | 4/14/93 | TI-17677 |

FIELD OF THE INVENTION

This invention generally relates to image sensor devices and more particularly to charge coupled devices.

BACKGROUND OF THE INVENTION

Without limiting the scope of the invention, its background is described in connection with charge coupled device (CCD) image sensors, as an example. Essential to good low noise performance of a CCD image sensor is the charge detection amplifier which converts charge stored at an individual photosite into a signal of adequate magnitude for further processing.

The most popular charge detection concept in CCD sensors is based on a floating diffusion circuit. A typical prior art charge detection amplifier consists of a floating diffusion detection node and an amplifier circuit. See Hynecek, J., "Method of Making Top Buss Virtual Phase Frame Interline Transfer CCD Image Sensor", U.S. Pat. No. 5,151,380, issued Sep. 29, 1992. The charge detection node is a conventional gated floating diffusion structure typically used with virtual phase CCDs and has an externally driven reset gate.

SUMMARY OF THE INVENTION

Generally, and in one form of the invention, the image sensor charge detection amplifier has a charge storage well, a charge sensor for sensing charge levels in the charge storage well, a charge drain adjacent to the charge storage well, and charge transfer structures for transferring charge from the charge storage well to the charge drain.

This invention provides several advantages. One advantage is that a complete reset of the structure is accomplished. There is no charge left in the detection well after the reset. Another advantage is that complete reset means no kTC noise. This leads to lower noise performance and simpler signal processing. Another advantage is the nondestructive charge readout. Since no charge is lost in the detection node, it can be transferred to another CCD stage. Another advantage is that this invention is a smaller structure than prior structures because the MOS transistor and the detection well are integrated into one device. The smaller structure leads to higher sensitivity which is also desirable. Another advantage is that additional internal or external circuits can be easily connected to this detection amplifier to increase the gain, to obtain gamma correction, or to obtain nonlinear signal compression which extends the dynamic range.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
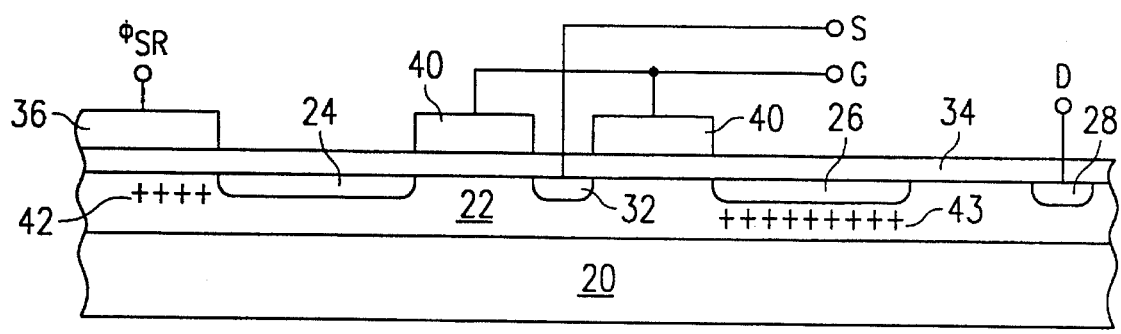
FIG. 1 is a cross-section of a first preferred embodiment low noise high sensitivity charge detection amplifier.

FIG. 1 is a cross-section of a first preferred embodiment of a low noise high sensitivity charge detection amplifier for high performance image sensors. The device is called a bulk charge detector (BCD) because the charge detection in this device can be viewed as detection of charge present in the bulk silicon under the P channel MOS structure. The structure of FIG. 1 includes a P type silicon substrate 20, an N type layer 22 in the substrate 20, P+ virtual phase regions 24 and 26 formed in the upper portion of N type layer 22, P+ source 32 formed in the upper portion of N type layer 22, gate insulator layer 34, transfer gate 36, transistor gate 40, donor implants 42 in the N type layer 22, donor implant 43 below virtual phase region 26, and N+ drain 28. Drain 28 can be replaced with another transfer gate similar to gate 36 in FIG. 1 or another CCD structure.

The operation of the device of FIG. 1 will be described below and is illustrated by the potential profile shown in FIG. 2, directly below the corresponding regions of the device of FIG. 1. These regions are given the following names: P+ regions 24 and 26 are called virtual gates (or virtual electrodes) and also serve as a drain for the active transistor, the region below the virtual gate 24 is called a virtual barrier, the region below virtual gate 26 is called a virtual well, the region below transfer gate 36 and below donor implant 42 is called a clocked well, the region below the transfer gate 36 and not below donor implant 42 is called a docked barrier, and the region below the transistor gate 40 is the transistor gate well.

Figure 3:
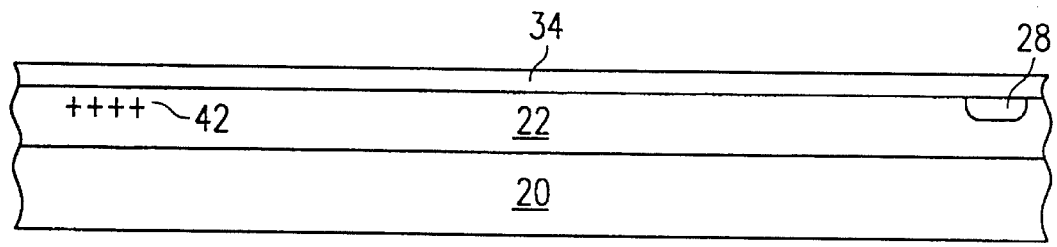
FIGS. 3–5 show the device of FIG. 1 at three stages of fabrication.
Figure 4:
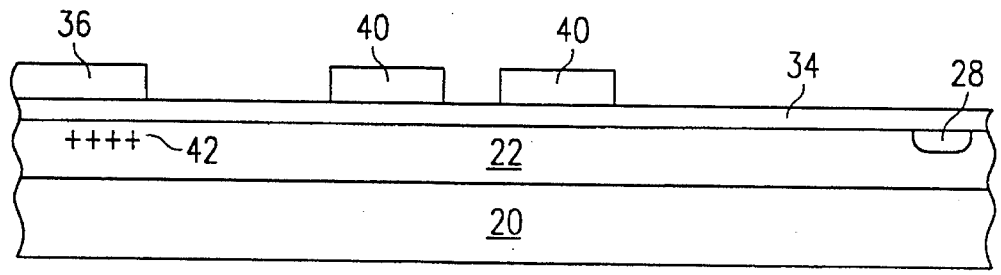
Figure 5:
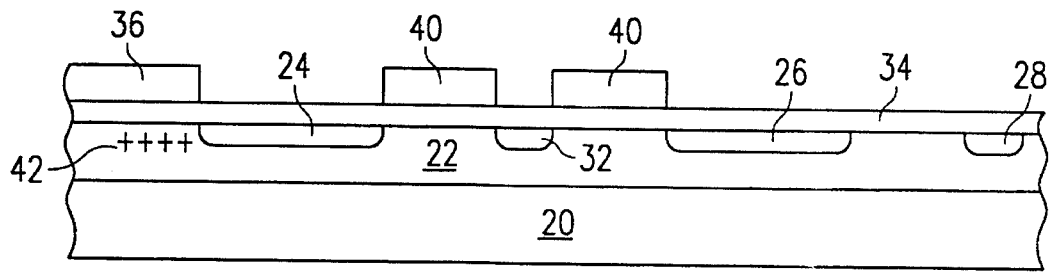

FIGS. 3–5 illustrate successive steps in a process for fabricating a low noise high sensitivity charge detection amplifier element according to the preferred embodiment, as shown in FIG. 1. Referring first to FIG. 3, an N type layer 22 is formed in P type semiconductor substrate 20. N type layer 22 may be formed by ion implantation. A dopant such as phosphorus may be used as the implant dopant. Then a gate insulator layer 34 is formed over the surface of the device. The gate insulator layer 34 is preferably formed of oxide and may be grown from the substrate. Next, a photoresist layer is used to pattern an implant into N type layer 22 to form the donor implants 42 shown in FIG. 3. This implant is done with an N type dopant such as arsenic or phosphorous. After the photoresist layer is stripped, another photoresist layer is used to pattern an implant into N type layer 22 to form N+ drain 28, shown in FIG. 3. This implant is also done with an N type dopant such as phosphorous or arsenic. In case of a nondestructive readout, the drain is replaced by another CCD structure.

After the photoresist layer is stripped, the transistor gate 40 and the transfer gate 36 are deposited, doped to be conductive, patterned, and etched, as shown in FIG. 4. The transistor gate 40 and the transfer gate 36 can be polysilicon, in which case they may be doped in place by a dopant such as phosphoric oxytrichloride ($POCl_3$). Next, the transistor gate 40 and the transfer gate 36 are used for a self-aligned implantation step to form P+ source 32 and P+ drain regions (virtual phase regions) 24 and 26, as shown in FIG. 5. This implant is done with a P type dopant such as boron. The region 32 may be doped separately from regions 24 and 26. Then a photoresist layer may be used to pattern an implant to form the donor implants 43 shown in FIG. 1. Alternatively, the donor implants 43 can be made in a self aligned manner. This implant is done with an N type dopant such as phosphorous.

The detection structure shown in FIG. 1 is an enclosed gate P-channel MOS transistor. Hole current is injected from the source 32 and flows into the P+ drains 24 and 26. The gate 40 of the device is kept at a suitable potential to form a well 60, shown in FIG. 2, for collection of charge underneath. As charge is transferred into this well 60, the transistor threshold is changed and this is sensed at the source 32. After the sensing is completed, signal charge is transferred out of the transistor gate well 60 by pulsing the transistor gate 40 negative. Charge is transferred out of the transistor gate well 60, through the virtual well 64, and into charge drain 28, or in the case of continuing CCD structures, into the clocked barrier and clocked well of the next CCD stage.

Figure 2:
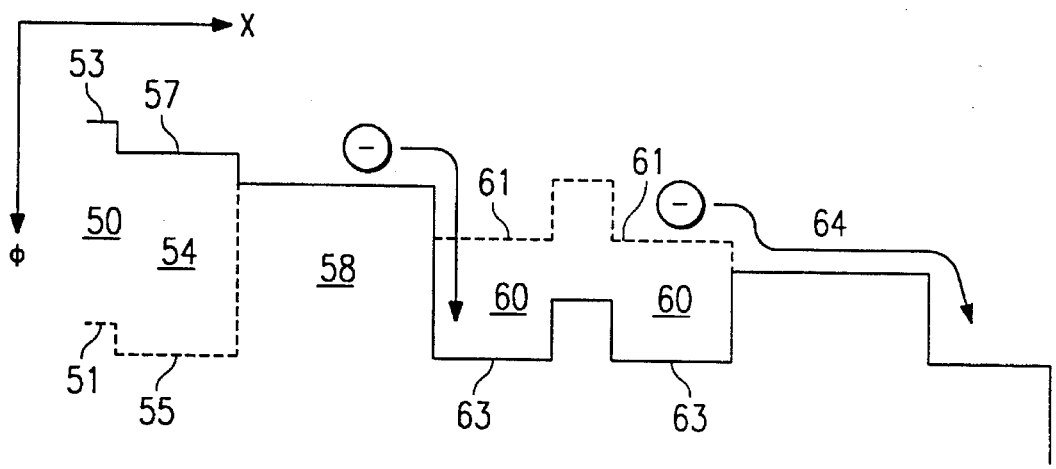
FIG. 2 is a diagram of the potential wells created by the device of FIG. 1.

The operation of the device of FIG. 1 is explained by referring to the potential profile shown in FIG. 2. The energy levels for an electron in the buried channel (conduction band minimum) are shown for the various regions of the device and for different bias levels of the transfer gate 36, and different bias levels of the transistor gate 40. Starting with an electron in the clocked barrier 50 at level 51 below transfer gate 36 with the transfer gate bias approximately equal to substrate bias, the operation is as follows. First the electron falls into the clocked well 54 at level 55. The electron will remain in the clocked well 54 as long as the transfer gate bias is approximately equal to substrate bias because the potential wells of both adjacent regions are at a lower potential. When the transfer gate 36 is switched to a negative bias with respect to the substrate 20, the potential level of the clocked well 54 changes to level 57 and the potential level of clocked barrier 50 changes to level 53. As a result, the electron passes from the clocked well 54 to the virtual barrier 58. The electron then moves from the virtual barrier 58 into the transistor gate well 60 at level 63 where the presence of charge is detected through sensing the potential of the source 32.

For reset, the transistor gate bias returns to a more negative voltage which changes the potential level of transistor gate well 60 from level 63 to level 61. As a result, the electron passes from the transistor gate well 60 to the virtual well 64. The electron then moves into the charge drain 28 where it is removed. The electron can also continue into another gate similar to gate 36 for nondestructive sensing. Charge removal from the well 60 is called reset. This reset process provides a complete charge removal from the structure because there is no charge remaining in the transistor well 60 after the charge is transferred to the charge drain 28 or to the next CCD stage.

Figure 6:
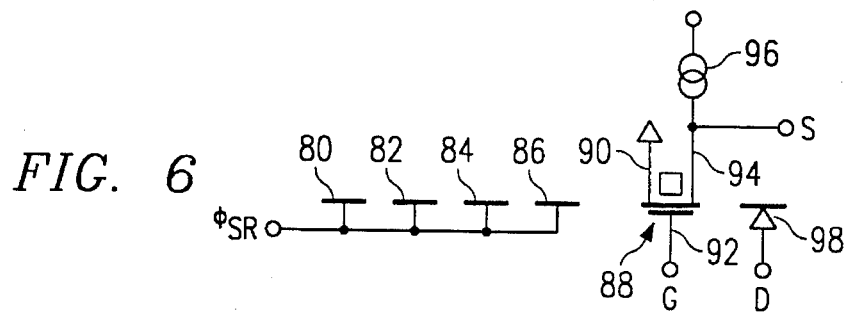
FIG. 6 is a simplified circuit diagram of the low noise high sensitivity charge detection amplifier with a source bias.

A simplified circuit diagram of the first preferred embodiment of the low noise high sensitivity charge detection amplifier is depicted in FIG. 6 and incorporates the structure of FIG. 1. The circuit includes transfer gates 80, 82, 84, and 86, active transistor 88, transistor drain 90, transistor gate 92, transistor source 94, current source 96, and charge drain 98. The current source 96 provides current to the source 94 which flows to the drain 90.

The transistor is a P-channel MOS device with enclosed source 32 and drain common to virtual phase regions 24 and 26. If the source 32 is biased by a constant current source 96 from a power supply, the potential of the source 32 will adjust itself to a level which will be sensitive to charge in the transistor region. This is similar to bulk charge modulated device (BCMD) operation, which is described in Hynecek, J., "Bulk Charge Modulated Transistor Threshold Image Sensor Elements and Method of Making", U.S. Pat. No. 4,901,129, issued Feb. 13, 1990. The P-channel transistor operates in a source follower mode with the gate-source threshold determined by the doping profiles of the structure and by the amount of electrons under the transistor gate.

The transfer gates 80, 82, 84, and 86 make up a portion of a CCD shift register. The remaining portion of the CCD shift register is not shown. The CCD shift register transfers charge to the charge detection amplifier. The structure of the transfer gates is shown by the transfer gate 36, shown in FIG. 1. Charge is transferred through the shift register to the charge detection node by docking the voltages on the transfer gates and the transistor gate. Once charge is transferred into the transistor gate well 60, charge is detected by sensing the voltage on the source 94 of transistor 88.

Figure 7:
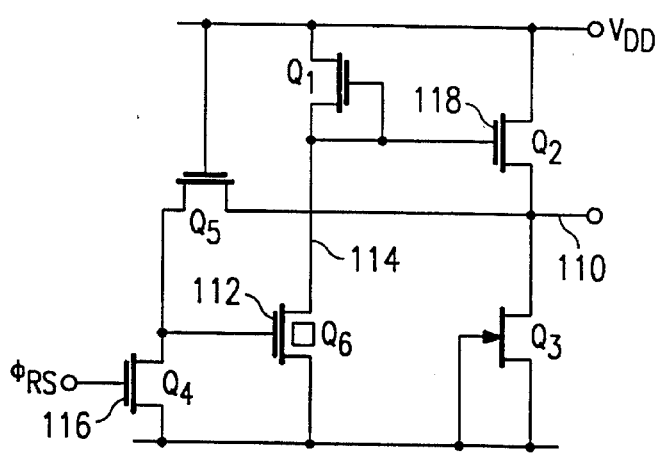
FIG. 7 is a circuit diagram of a first preferred embodiment positive feedback circuit for a low noise high sensitivity charge detection amplifier.

FIG. 7 is a diagram of a preferred embodiment positive feedback circuit for the BCD detector of FIG. 1. The circuit includes BCD active transistor $Q_6$, and transistors $Q_1$, $Q_2$, $Q_3$, $Q_4$, and $Q_5$. In the circuit of FIG. 7, transistor $Q_5$ provides positive feedback from the output on line 110 to the gate 112 of the BCD detector $Q_6$. This feedback increases the detection node sensitivity several times (3 to 5 times). Transistor $Q$, is a current source for bias of BCD transistor $Q_6$. Transistor $Q_1$ is connected between a voltage source $V_{DD}$ and the source 114 of the BCD transistor $Q_6$, $Q_2$ is a source follower which provides the output on line 110. The gate 118 of source follower transistor $Q_2$ is coupled to the source 114 of the BCD transistor $Q_6$. $Q_4$ serves as a switch to accomplish reset, A reset pulse is coupled to the gate of transistor $Q_4$. Transistor $Q_3$ is a resistive load for transistor $Q_2$.

Figure 9:
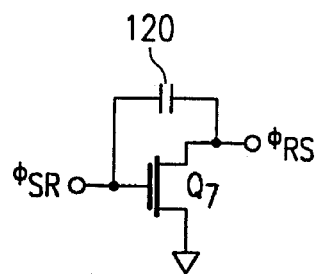
FIG. 9 is a circuit diagram of a circuit for generating the reset signal from the serial register signal.

Additional circuits such as that shown in FIG. 9 can be added to the amplifier of FIG. 7 to derive the reset pulse automatically from the serial register dock signal. The circuit of FIG. 9 includes transistor $Q_7$ and capacitor 120. The circuit of FIG. 9 generates the reset pulse from the leading edge of the serial register dock signal. The amplitude of the reset pulse depends on the threshold of the transistor $Q_7$ and the DC level of the shift register dock signal $\phi_{SR}$.

Figure 8:
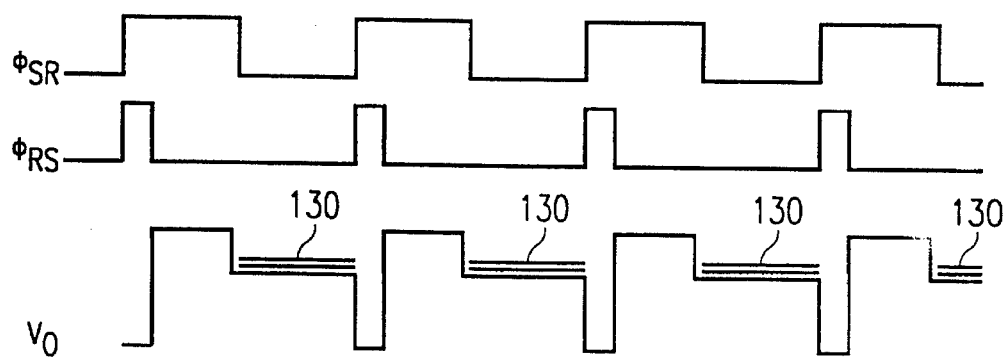
FIG. 8 is a wave form diagram of the inputs and the output of the circuit of FIG. 7.

FIG. 8 is a timing diagram showing the inputs to the device of FIG. 7. $\phi_{SR}$ is the serial register dock signal which controls the CCD shift register. $\phi_{RS}$ is the input to the gate 116 of transistor $Q_4$. $V_o$ is the output signal on line 110 in FIG. 7.

The timing cycle starts with a reset period to clear charge from the BCD transistor well 60. For the reset period, the reset signal $\phi_{RS}$ is switched from low to high. The high reset signal $\phi_{RS}$ turns on transistor $Q_4$ which lowers the voltage on the gate 112 of BCD transistor $Q_6$. The lower gate voltage on $Q_6$ causes the transistor gate well 60 to change to potential level 61, shown in FIG. 2. This forces charge to move from the transistor well 60 to the charge drain 28. During the reset period, $\phi_{SR}$ is at a high voltage so that the transfer well 54 is at potential level 55. The transfer well holds charge while the transistor well 60 is being cleared of charge.

After the reset period, the reset signal is switched to a lower voltage. This turns off transistor $Q_4$ and allows the gate voltage on the BCD transistor $Q_6$ to rise. The higher gate voltage on $Q_6$ creates potential well 60 at level 63, shown in FIG. 2. Then the BCD transistor $Q_6$ is ready to receive charge from the shift register. The serial register dock signal $\phi_{SR}$ is then switched to a low voltage which changes the potential of transfer well 54 from level 55 to level 57. This causes charge in the last transfer well 54, shown in FIG. 2, to move into the transistor well 60. When charge moves into the transistor well 60, the potential level of the transistor well 60 changes. The potential level of the transistor well is dependent on the amount of charge that is transferred from the last transfer well of the serial register. This change in potential level is sensed on the source 114 of the BCD transistor $Q_6$. The dependency on the amount of charge is shown by the variable output voltage level 130, shown in FIG. 8.

Figure 10:
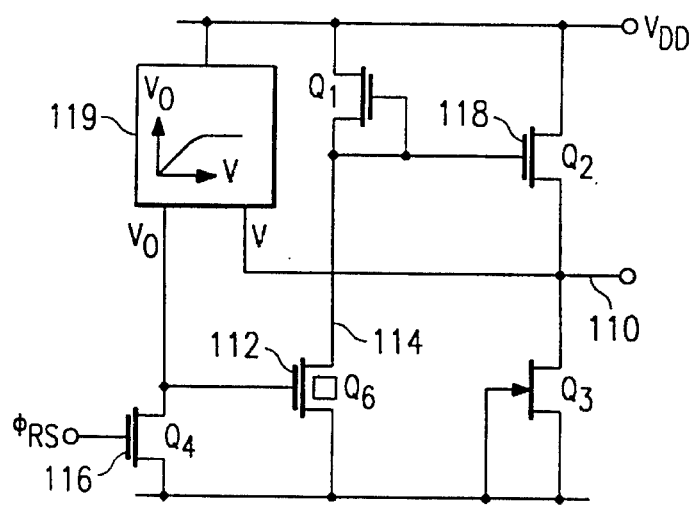
FIG. 10 is a circuit diagram of a second preferred embodiment positive feedback circuit for a low noise high sensitivity charge detection amplifier.

Once charge is sensed by the source of transistor $Q_6$, the feedback of the amplifier circuit of FIG. 7 increases the sensitivity of the charge detector by changing the gate voltage on the BCD transistor $Q_6$ according to the change in the source voltage through the feedback path provided by transistor $Q_5$. It is also possible to replace transistor $Q_5$ with a more sophisticated circuit 119, shown in FIG. 10, with a nonlinear transfer characteristic. This feature can be used to increase the dynamic range of the detector by nonlinear signal compression. If the transfer characteristic of the feedback path is properly selected, it is possible to obtain the TV gamma correction directly at the charge detection node.

Because of the complete charge clearing reset process of the BCD detector, the device has no kTC noise. This leads to lower noise performance and simpler signal processing. Noise of the BCD detector can be estimated by the equations below. The following equations are from a simple model for a MOS transistor:

$$I = \frac{1}{2} \frac{w}{L} \mu C_{ox}(V_G - V_T)^2$$

$$g_m = \frac{w}{L} \mu C_{ox}(V_G - V_T)$$

$$\frac{I}{g_m} = \frac{1}{2}(V_G - V_T)$$

where
$\mu$=majority carrier mobility
$C_{ox}$=gate capacitance per unit area
w=channel width
L=channel length
$g_m$=transconductance Noise is given by the well known equation:

$$v_n = \sqrt{4 \frac{kT}{g_m} f_b}$$

By substituting for $g_m$ from the transistor model above, the following noise equation is derived:

$$v_n = \sqrt{\alpha 2 \frac{kT}{q} \frac{qf_b}{I}(V_G - V_T)}$$

where
kT is thermal energy.
$f_b$ is frequency bandwidth.
$\alpha$ is a factor less than or equal to 2 used to include noise of the bias circuit.
Typical values of the parameters are:
$V_G - V_T = 1$ V
$\alpha = 2$
$f_b = 10$ MHz
I=20 µA Substituting the typical values into the equation for $v_n$, noise will be $v_n$=90 µV. Typical charge conversion sensitivity achievable with this structure is 10 µV/e$^-$. This leads to the noise equivalent electrons of $N_{ee}$=9 e$^-$ which is a respectable value for a 10 MHz bandwidth.

Figure 11:
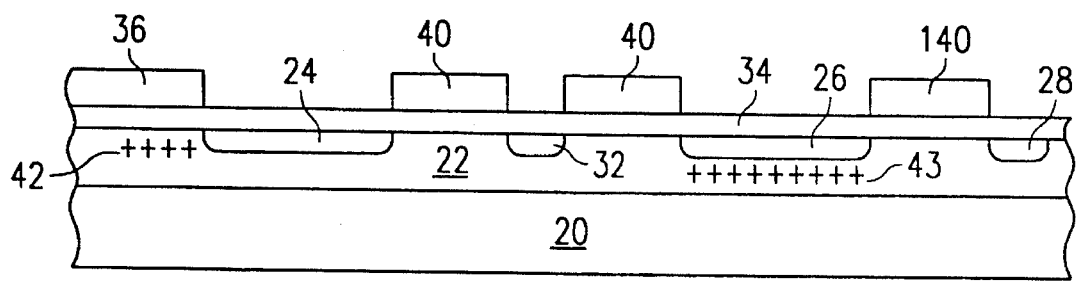
FIG. 11 is a cross-section of a second preferred embodiment low noise high sensitivity charge detection amplifier.

In an alternative embodiment, shown in FIG. 11, another gate 140 can be added to the circuit. The gate 140 gives more flexibility for charge transfer from transistor well 60.

Also, another complete CCD structure can be added to the circuit of FIG. 1 in place of the charge clearing drain 28 to facilitate nondestructive readout.

This invention provides several advantages. One advantage is that a complete reset of the structure is accomplished. There is no charge left in the detection well after the reset. Another advantage is that complete reset means no kTC noise. This leads to lower noise performance and simpler signal processing. Another advantage is nondestructive readout capability. Another advantage is that this invention is a smaller structure than prior structures because the MOS transistor and the detection well are integrated into one device. The smaller structure leads to higher sensitivity which is also desirable. Another advantage is that additional internal or external circuits can be easily connected to this detection amplifier to increase the gain, to obtain gamma correction, or to obtain nonlinear signal compression which extends the dynamic range.

A few preferred embodiments have been described in detail hereinabove. It is to be understood that the scope of the invention also comprehends embodiments different from those described, yet within the scope of the claims.

For example, additional circuits can be added to this amplifier to derive the reset pulse automatically from the serial register clock signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An active transistor charge detection device comprising:

a semiconductor substrate of a first conductivity type;
a semiconductor layer of a second conductivity type in the substrate;

virtual phase regions of the first conductivity type formed in the semiconductor layer, the virtual phase regions forming virtual phase potential areas for carriers of the second conductivity type;

a transistor source region of a first conductivity type formed in the semiconductor layer and spaced apart from the virtual phase regions;

a charge drain region of a second conductivity type formed in the semiconductor layer and spaced apart from the virtual phase regions;

an insulating layer on the semiconductor layer;

a transistor gate electrode formed on the insulating layer, the transistor gate electrode is located above a portion of the semiconductor layer that surrounds the transistor source region and is between virtual phase regions, the transistor gate electrode forming a transistor potential well for carriers of the second conductivity type in response to a voltage;

a transfer gate electrode formed on the insulating layer and separated from the transistor gate electrode by a virtual phase region, the transistor gate electrode located between the transfer gate electrode and the charge drain, the transfer gate electrode forming a transfer potential area for carriers of the second conductivity type in response to a voltage, wherein charge is transferred between potential areas by changing the voltages on the transfer gate electrode and the transistor gate electrode.

2. The device of claim 1 wherein charge level in the transistor potential well is sensed by the transistor source region.

* * * * *